United States Patent
Ives et al.

(10) Patent No.: US 11,881,708 B2
(45) Date of Patent: Jan. 23, 2024

(54) COMMON MODE VOLTAGE FEED FAULT PROTECTION

(71) Applicant: Hamilton Sundstrand Corporation, Charlotte, NC (US)

(72) Inventors: Kyle Stephen Ives, Loves Park, IL (US); Michael C. Harke, DeForest, WI (US); Tom A. Utecht, Cherry Valley, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 17/836,272

(22) Filed: Jun. 9, 2022

(65) Prior Publication Data

US 2023/0402837 A1 Dec. 14, 2023

(51) Int. Cl.
| | |
|---|---|
| *H02H 9/04* | (2006.01) |
| *H02H 3/10* | (2006.01) |
| *H02H 7/06* | (2006.01) |
| *G01R 31/00* | (2006.01) |
| *H02H 7/125* | (2006.01) |
| *H02H 3/34* | (2006.01) |

(52) U.S. Cl.
CPC .......... *H02H 9/041* (2013.01); *G01R 31/008* (2013.01); *H02H 3/105* (2013.01); *H02H 3/34* (2013.01); *H02H 7/06* (2013.01); *H02H 7/125* (2013.01)

(58) Field of Classification Search
CPC .............................. H02H 9/041; G01R 31/008
See application file for complete search history.

(56) References Cited

U.S. PATENT DOCUMENTS

| | | | |
|---|---|---|---|
| 5,654,859 A | 8/1997 | Shi | |
| 6,433,554 B1 * | 8/2002 | Kawate | G01D 3/08 |
| | | | 324/705 |
| 8,305,723 B2 | 11/2012 | Vedula et al. | |
| 8,531,804 B2 | 9/2013 | Weems, II et al. | |
| 9,912,310 B2 | 3/2018 | Saloio, Jr. et al. | |

(Continued)

FOREIGN PATENT DOCUMENTS

| | | |
|---|---|---|
| JP | 2012078289 A | 4/2012 |
| KR | 101090263 b1 | 12/2011 |

OTHER PUBLICATIONS

Extended European Search Report issued in corresponding European Patent Application No. 23176535.5 dated Oct. 27, 2023. (8 pages).

*Primary Examiner* — Scott Bauer
(74) *Attorney, Agent, or Firm* — Locke Lord LLP; Joshua L. Jones; Scott D. Wofsy

(57) ABSTRACT

A system includes a generator. Three AC feeders are connected for feeding AC output from the generator. A rectifier is electrically connected to the three AC feeders and to a load via a first DC feeder and a second DC feeder. A first resistor connects between a first one of the DC feeders and ground. A first voltage sensor is operatively connected to detect voltage across the first resistor. A second resistor connects between the second DC feeder and ground. A second voltage sensor is operatively connected to detect voltage across the second resistor. A controller is configured to monitor for changes in common mode voltage based on the input from the first sensor and from the second sensor, and to determine presence of a fault if change in the common mode voltage exceeds a predetermined threshold.

12 Claims, 2 Drawing Sheets

(56) References Cited

U.S. PATENT DOCUMENTS

| | | | |
|---|---|---|---|
| 10,768,242 B1* | 9/2020 | Kitchin | H02J 4/00 |
| 2009/0184717 A1 | 7/2009 | Ivan et al. | |
| 2014/0168825 A1* | 6/2014 | Patel | H02P 9/102 |
| | | | 361/21 |
| 2018/0306853 A1* | 10/2018 | Kell | G01R 31/086 |
| 2020/0133319 A1* | 4/2020 | Loder | H02M 7/5387 |
| 2020/0223313 A1 | 7/2020 | Ishida | |
| 2022/0283206 A1* | 9/2022 | Heo | H02J 7/0047 |
| 2022/0397593 A1* | 12/2022 | Stoica | G01R 27/28 |

* cited by examiner

Time
DC Feeder Fault

Time
AC Feeder Fault

COMMON MODE VOLTAGE FEED FAULT PROTECTION

BACKGROUND

1. Field

The present disclosure relates to ground fault protection for electrical systems, and more particularly to fault protection for systems such as aircraft.

2. Description of Related Art

Traditional constant frequency or variable frequency generation systems on aircraft have a neutral connection which is brought out of the generator and tied to ground. If an electrical feeder in the distribution system became shorted to ground, large amounts of current would flow back to the generator through the airframe. This type of historical electrical system grounding topology enabled adequate current sourcing levels and an provided associated current sensing functionality for the fault to be detected and isolated by generation/distribution equipment controllers.

To reduce aircraft weight on future applications, electrical system designs are continuing to expand utilization of high voltage DC generation and distribution at +/−270 Vdc or +/−540 Vdc. With an +/−270 Vdc, +/−540 Vdc or equivalent system, beyond traditional generator neutral grounding, an impedance grounding scheme topology option interfaced at the system rectifier output midpoint is feasible. This type of impedance grounding approach is an important factor when compared to traditional generator neutral grounding, impacting electrical system performance characteristics and overcurrent protection coordination during feeder/load equipment ground faults.

For ground schemes that have the generator neutral floating with respect to ground, and the DC link of the rectifier is connected to ground through a resistor, which has some distinct advantages as a grounding approach. Namely, a fault of either an AC or DC aircraft feeder to the airframe will significantly reduce fault sourcing current levels and does not appreciably affect the DC output performance, allowing the system to continue to operate if desired. Reduced fault current with a high impedance ground fault condition has benefit for high voltage DC systems to mitigate potential equipment damage. However, since large amounts of current no longer flow during the fault condition, traditional current based feeder fault detection methods are no longer viable with this impedance grounding topology, so new methods need to be developed for fault isolation coordination.

Conventional generator neutral grounded systems and associated overcurrent fault detection techniques have been considered satisfactory for their intended purpose. However, there is a need for improved ground fault detection for power systems aboard aircraft utilizing high voltage DC generation/distribution.

SUMMARY

A system includes a generator. Three AC feeders are connected for feeding AC output from the generator. A rectifier is electrically connected to the three AC feeders. The rectifier is configured to convert three phase AC from the three AC feeders of the generator into DC output to a load via a first DC feeder and a second DC feeder. A first resistor connects between a first one of the DC feeders and ground. A first voltage sensor is operatively connected to detect voltage across the first resistor. A second resistor connects between the second DC feeder and ground. A second voltage sensor is operatively connected to detect voltage across the second resistor. A controller is operatively connected to receive input from the first voltage sensor and from the second voltage sensor. The controller is configured to monitor for changes in common mode voltage based on the input from the first sensor and from the second sensor, and to determine presence of a fault if change in the common mode voltage exceeds a predetermined threshold.

The controller can be configured to determine presence of a fault if change in value of the common mode voltage exceeds a predetermined threshold. The controller can be configured to determine the fault is located in one of the DC feeders if the value of the common mode voltage is constant at a level beyond a predetermined threshold. The controller can be configured to isolate the fault to a positive DC feeder if the common mode voltage is negative, and to isolate the fault to a negative DC feeder if the common mode voltage is positive. The controller can be configured to determine the fault is located in one of the AC feeders if the value of the common mode voltage follows a waveform. The controller can be configured to determine the in which one of the AC feeders the fault is located based on phase angle of the value of the common mode voltage matching phase angle sensed in the AC feeder with the fault.

A DC filter can be operatively connected to each of the first and second DC feeders, and to ground, wherein the DC filter is configured to reduce noise in the first and second DC feeders. A DC load can be operatively connected to each of the first and second DC feeders, wherein the load is configured to utilized DC power from the first and second DC feeders. A second set of three AC feeders can connect a second three phases of the AC generator to a second rectifier. The second rectifier can include two DC feeders operatively connected to the two DC feeders of the first rectifier. A second generator and at least one respective rectifier of the second generator can be included, wherein two DC feeders of the at least one respective rectifier of the second generator are connected in parallel to the first and second DC feeders, respectively, of the first rectifier. The controller can be part of a generator control unit (GCU) or rectifier operatively connected to control the generator, part of a motor control unit (MCU) connected to control a motor connected to be powered as a load by the first and second DC feeders, or a separate controller from the GCU, rectifier, and MCU. The controller can be configured to take corrective action upon detection of a fault. The controller can be configured to de-excite the generator, disconnect the motor from power, or provide an alternative source of power to the load as the corrective action.

A method includes detecting a first voltage across a first resistor between a first DC feeder from a rectifier and ground, detecting a second voltage across a second resistor between a second DC feeder from the rectifier and ground, and using the first and second voltages to calculate a common mode voltage. The method includes determining the common mode voltage, and determining a fault has occurred base on a change in the common mode voltage that exceeds a predetermined threshold.

The method can include determining the fault is located in one of the DC feeders if the common mode voltage is constant, and if the fault is located in one of the DC feeders: isolating the fault to a positive DC feeder if the common mode voltage is negative; and isolating the fault to a negative DC feeder if the common mode voltage is positive. The method can include determining the fault is located in one of the AC feeders if the common mode voltage follows an AC waveform, and if the fault is located in one of the AC feeders: determining which one of the AC feeders has the fault wherein phase angle of the common mode voltage matches phase angle sensed in one of the AC feeder that has the fault.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
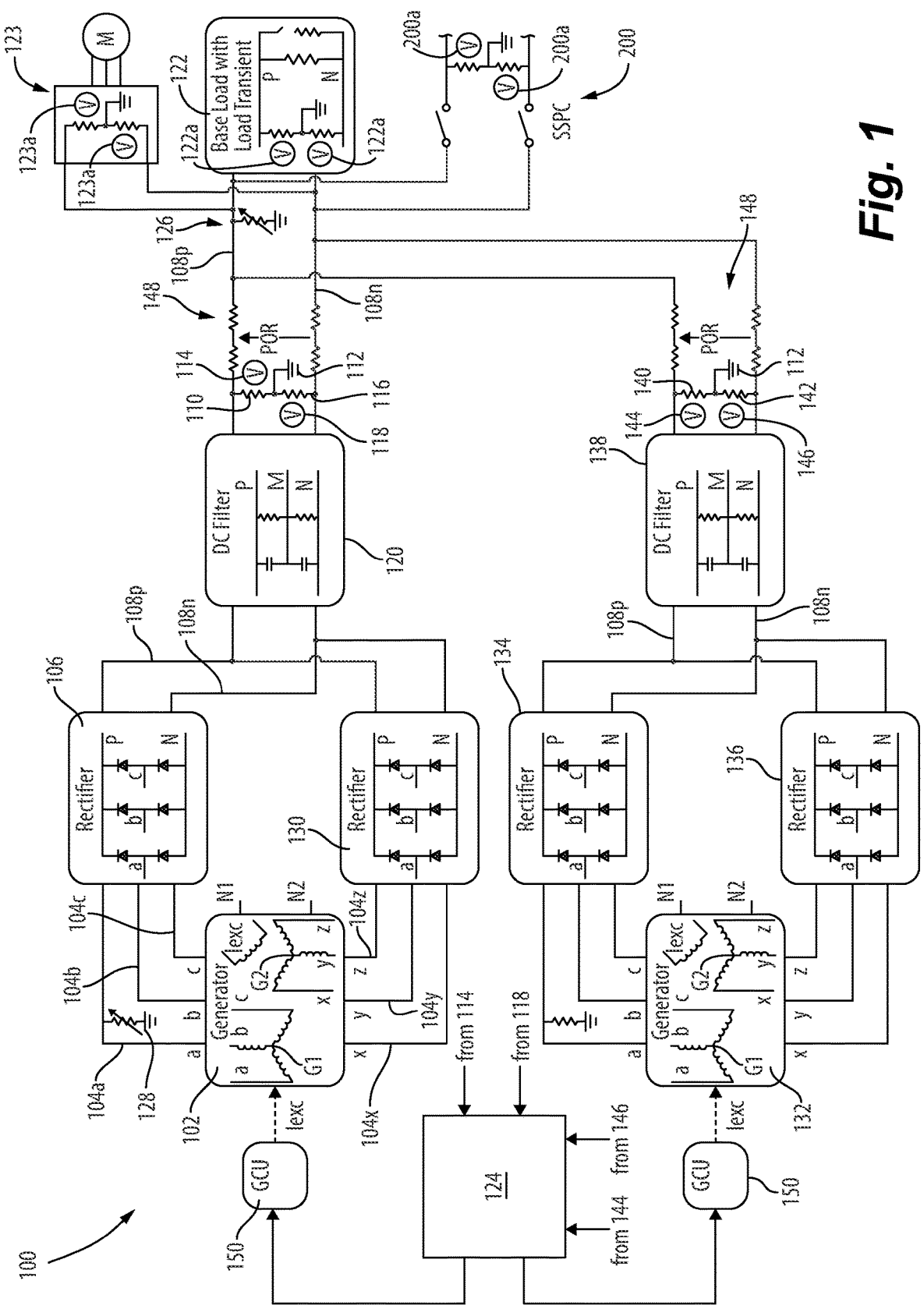
FIG. 1 is a schematic view of an embodiment of a system constructed in accordance with the present disclosure, showing the generators, rectifiers with high impedance ground, feeders, and load equipment interface with motor controller/motor and SSPC (solid state power controller) device distribution.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-3, as will be described. The systems and methods described herein can be used to detect AC feeder faults, DC feeder faults, and distribution ground faults using common mode voltage.

The system 100 includes a generator 102. Three AC feeders 104a, 104b, 104c are connected for feeding AC output from the generator 102. A rectifier 106 is electrically connected to the three AC feeders 104a, 104b, 104c. The rectifier 106 is configured to convert three phase AC from the three AC feeders 104a, 104b, 104c of the generator 102 into DC output to a load via a first DC feeder 108p and a second DC feeder 108n. A first resistor 110 connects between the DC feeder 108p and ground 112. A first voltage sensor 114 is operatively connected to detect voltage across the first resistor 110. A second resistor 116 connects between the second DC feeder 108n and ground 112. A second voltage sensor 118 is operatively connected to detect voltage across the second resistor 116. A DC filter 120 is operatively connected to each of the first and second DC feeders 108p, 108n, and to ground 112, wherein the DC filter 120 is configured to reduce noise in the first and second DC feeders 108p, 108n. The resistors 110 and 116 with voltage sensors 114 and 118 could be integrated as part of an associated channel Rectifier/DC Filter combined unit.

DC load(s) 122 is/are operatively connected to each of the first and second DC feeders 108p, 108n, wherein the load 122 is configured to utilized DC power from the first and second DC feeders 108p, 108n and can host common mode voltage sense functionality 122a (with sensors on each feeder or as a single sensor coupling each feeder). DC load(s) can also be interfaced with SSPC (solid state power controller)+/−270 Vdc devices 200, which include integrated common mode voltage sense functionality 200a (e.g. with sensors on each feeder or as a single sensor coupling each feeder). Additional load equipment interface may include, motor controller/motor equipment 123, also including integrated common mode voltage sense functionality 123a (e.g. with sensors on each feeder or as a single sensor coupling each feeder).

Figure 2:
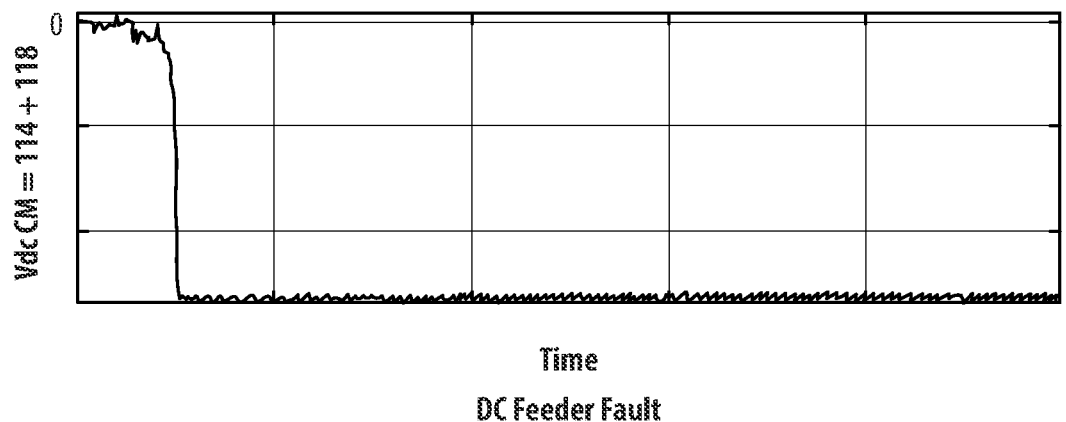
FIG. 2 is a graph showing a DC feeder fault apparent in the common mode voltage for the system of FIG. 1.

A controller 124 is operatively connected to receive input from the first voltage sensor 114 and from the second voltage sensor 118. The controller 124 is configured to monitor for changes in common mode voltage based on the input from the first and second sensors 114, 118, and to determine presence of a DC feeder to ground fault 126, or AC feeder to ground fault 128, if change in the common mode voltage exceeds a predetermined threshold. The common mode voltage is the sum of the voltage measurements from the sensors 114, 118 as indicated in FIGS. 2-3.

The controller 124 is configured to determine presence of a fault if change in value of the common mode voltage exceeds a predetermined threshold. The controller 124 can determine the fault 126 is located in one of the DC feeders 108p, 108n if the common mode voltage is constant at a level beyond a predetermined threshold, i.e. always on the same side of zero with sufficient magnitude in the common mode (Vdc CM) graph in FIG. 2. This type of fault is indicated schematically in FIG. 1 with the fault 126, which is shown in the feeder 108p, but could be in the feeder 108n as well. The controller is configured to isolate the fault to a positive DC feeder (feeder 108p) if the common mode voltage is negative (FIG. 2 shows negative Vdc CM value for a positive DC feeder to ground fault), and to isolate the fault to a negative DC feeder (feeder 108n) if the common mode voltage is positive.

Figure 3:
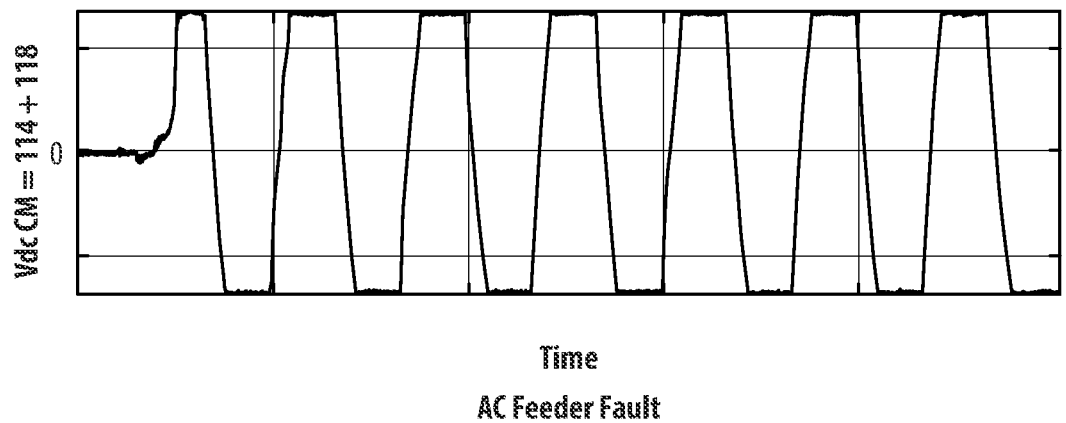
FIG. 3 is a graph showing an AC feeder fault apparent in the common mode voltage for the system of FIG. 1.

The controller 124 is configured to determine the fault 128 is located in one of the AC feeders 104a, 104b, 104c if the common mode voltage follows a waveform, i.e. increases in magnitude with crosses over zero as in the common mode (Vdc CM) graph in FIG. 3. The fault 128 is shown schematically in FIG. 1 in the feeder 104a, but it could be in the other two AC feeders 104b, 104c as well. The controller 124 can determine the in which one of the AC feeders 104a, 104b, 104c the fault 128 is located based on phase angle of the common mode voltage matching phase angle sensed in the AC feeder 104a, 104b, 104c with the fault 128.

With ongoing reference to FIG. 1, any suitable number of generators, feeders, rectifiers, filters can be included. A second set of three AC feeders 104x, 104y, 104z connect a second three phases of the AC generator 102 to a second rectifier 130. The second rectifier 130 includes two DC feeders 108p, 108n operatively connected to the two DC feeders of the first rectifier 106, i.e. the feeders 108p and 108n are connected in parallel for the two rectifiers 106 and 130, which can share the same DC filter 120.

A second generator 132 and at least respective rectifiers 134, 136 of the second generator 132 can be included, wherein two DC feeders 108p, 108n of the at rectifiers 134, 136 of the second generator 132 are connected to the first and second DC feeders, respectively, of the first rectifier 106, 130, i.e. the respective DC feeders 108p, 108n are all connected in parallel for all four rectifiers 106, 130, 134, 136. The six respective AC feeders of the second generator 132 are not numbered, for sake of clarity in the drawing, but are connected to respective rectifiers 134, 136 in the same manner described above for generator 102. The rectifiers 134, 136 are operatively connected to their own DC filter 138 in the same manner described above for rectifiers 106, 130. There can be additional resistors 140, 142 connected to ground 112, with respective voltage sensors 144, 146 all connected to the feeders 108p, 108n, and to the controller 124 in the same manner as for those resistors 110, 116 described above. Also, the resistors 140 and 142 with voltage sensors 144 and 146 could be integrated as part of an associated channel Rectifier/DC Filter combined unit. Each of the generators 102, 132 can have a respective POR (point of regulation) 148 between its respective DC filter 120, 138 and the load 122. For example, the GCU (generator control unit) can regulate the POR 148 to +/−270 Vdc (540 Vdc across feeders), but other voltage levels are conceivable, depending on application, such as +/−540 (1080 Vdc across feeders).

The controller 124 can be a separate unit, or can be part of one or more a generator control units (GCUs) 150 operatively connected to control the generators 102, 132. It is also contemplated that the controller 124 can be part of rectifiers 106, 130, 134, 136 or a motor control unit (MCU) 123 connected to control a motor connected to be powered as a load 122 by the first and second DC feeders 108p,108n. A controller 124 can also be part of SSPC (solid state power controller) devices 200 for common mode detection in the distribution system. The controller 124 is configured to take corrective action upon detection of a fault 126, 128. For example, the controller 124 can de-excite the affected the generator 102, 132, disconnect the motor (e.g. in load 122) from power, provide an alternative source of power to the load 122 as the corrective action, alert other systems or users of the fault, or the like.

Systems and methods as disclosed herein provide potential benefits for high impedance ground applications such as good system power quality performance, no significant common mode (CM) voltage during normal operation, quick recovery from system fault, and current does not flow to ground in the presence of a single fault to ground—allowing for potential continued operation. Systems and methods as disclosed herein provide potential benefits for common mode (CM) voltage based feeder fault detection including utilizing existing sensing for control, potentially eliminating dedicated current sensors—lowering aircraft weight and cost, the ability to isolate faults to different feeders based on CM voltage signature giving some ability to isolate faults without staged timing, and potentially using simple average/RMS calculations for fault detection—with no complex algorithms required.

The methods and systems of the present disclosure, as described above and shown in the drawings, provide for detection of AC feeder faults and DC feeder faults using common mode voltage. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
  a generator;
  three AC feeders connected for feeding AC output from the generator;
  a rectifier electrically connected to the three AC feeders, the rectifier being configured to convert three phase AC from the three AC feeders of the generator into DC output to a load via a first DC feeder and a second DC feeder;
  a first resistor connecting between a the first DC feeder and ground;
  a first voltage sensor operatively connected to detect voltage across the first resistor;
  a second resistor connecting between the second DC feeder and ground;
  a second voltage sensor operatively connected to detect voltage across the second resistor; and
  a controller operatively connected to receive input from the first voltage sensor and from the second voltage sensor, wherein the controller is configured to monitor for changes in common mode voltage based on the input from the first sensor and from the second sensor, and to determine presence of a fault if change in the common mode voltage exceeds a predetermined threshold, wherein the controller is configured to determine presence of a fault if change in value of the common mode voltage exceeds a predetermined threshold, wherein the controller is configured to isolate the fault to a positive DC feeder if the common mode voltage is negative, and to isolate the fault to a negative DC feeder if the common mode voltage is positive.

2. The system as recited in claim 1, wherein the controller is configured to determine the fault is located in one of the DC feeders if the common mode voltage is constant at a level beyond a predetermined threshold.

3. The system as recited in claim 1, further comprising a DC filter operatively connected to each of the first and second DC feeders, and to ground, wherein the DC filter is configured to reduce noise in the first and second DC feeders.

4. The system as recited in claim 1, further comprising a DC load operatively connected to each of the first and second DC feeders, wherein the load is configured to utilized DC power from the first and second DC feeders.

5. The system as recited in claim 1, wherein the three AC feeders are a first set of AC feeders connecting a first three phases of the AC generator to the rectifier, wherein the rectifier is a first rectifier and further comprising:
  a second set of three AC feeders connecting a second three phases of the AC generator to a second rectifier, wherein the second rectifier includes two DC feeders operatively connected to the two DC feeders of the first rectifier.

6. The system as recited in claim 5, further comprising a second generator and at least one respective rectifier of the second generator, wherein two DC feeders of the at least one respective rectifier of the second generator are connected in parallel to the first and second DC feeders, respectively, of the first rectifier.

7. The system as recited in claim 1, wherein the controller is part of a generator control unit (GCU) or rectifier operatively connected to control the generator, part of a motor control unit (MCU) connected to control a motor connected to be powered as a load by the first and second DC feeders, or a separate controller from the GCU, rectifier, and MCU.

8. The system as recited in claim 7, wherein the controller is configured to take corrective action upon detection of a fault.

9. The system as recited in claim 7, wherein the controller is configured to de-excite the generator, disconnect the motor from power, or provide an alternative source of power to the load as the corrective action.

10. A system comprising:
   a generator;
   three AC feeders connected for feeding AC output from the generator;
   a rectifier electrically connected to the three AC feeders, the rectifier being configured to convert three phase AC from the three AC feeders of the generator into DC output to a load via a first DC feeder and a second DC feeder;
   a first resistor connecting between a the first DC feeder and ground;
   a first voltage sensor operatively connected to detect voltage across the first resistor;
   a second resistor connecting between the second DC feeder and ground;
   a second voltage sensor operatively connected to detect voltage across the second resistor; and
   a controller operatively connected to receive input from the first voltage sensor and from the second voltage sensor, wherein the controller is configured to monitor for changes in common mode voltage based on the input from the first sensor and from the second sensor, and to determine presence of a fault if change in the common mode voltage exceeds a predetermined threshold, wherein the controller is configured to determine presence of a fault if change in value of the common mode voltage exceeds a predetermined threshold, wherein the controller is configured to determine the fault is located in one of the AC feeders if the common mode voltage follows an AC waveform.

11. The system as recited in claim 10, wherein the controller is configured to determine the in which one of the AC feeders the fault is located based on phase angle of the value of the common mode voltage matching phase angle sensed in the AC feeder with the fault.

12. A method comprising:
   detecting a first voltage across a first resistor between a first DC feeder from a rectifier and ground;
   detecting a second voltage across a second resistor between a second DC feeder from the rectifier and ground;
   using the first and second voltages to calculate a common mode voltage;
   determining the common mode voltage;
   determining a fault has occurred base on a change in the common mode voltage that exceeds a predetermined threshold;
   determining the fault is located in one of the DC feeders if the common mode voltage is constant, and if the fault is located in one of the DC feeders:
      isolating the fault to a positive DC feeder if the common mode voltage is negative; and
      isolating the fault to a negative DC feeder if the common mode voltage is positive; and
   determining the fault is located in one of the AC feeders if the common mode voltage follows an AC waveform, and if the fault is located in one of the AC feeders:
   determining which one of the AC feeders has the fault wherein phase angle of the common mode voltage matches phase angle sensed in one of the AC feeder that has the fault.

* * * * *